(12) United States Patent
Chen

(10) Patent No.: US 6,205,662 B1
(45) Date of Patent: Mar. 27, 2001

(54) METHOD OF PRODUCING A BUILT-UP HEAT EXCHANGER AND PRODUCT THEREOF

(76) Inventor: Yun-Ching Chen, 2nd F., No. 10, Lane 147, Yan-Ping N. Rd., Sec. 5, Taipei (TW)

( * ) Notice: Subject to any disclaimer, the term of this patent is extended or adjusted under 35 U.S.C. 154(b) by 0 days.

(21) Appl. No.: 09/312,041

(22) Filed: May 14, 1999

(51) Int. Cl.$^7$ .................................................. B23P 15/00
(52) U.S. Cl. ................................ 29/890.03; 29/890.039
(58) Field of Search .................... 29/890.03, 890.034, 29/890.039

(56) References Cited

U.S. PATENT DOCUMENTS

| | | | |
|---|---|---|---|
| 1,563,502 | * 12/1925 | Korb | 29/890.03 |
| 5,111,577 | * 5/1992 | Sheridan et al. | 29/890.039 |
| 5,819,407 | * 10/1998 | Terada | 29/890.03 |
| 5,979,050 | * 11/1999 | Counterman et al. | 29/890.034 |

* cited by examiner

Primary Examiner—I. Cuda Rosenbaum
(74) Attorney, Agent, or Firm—Pro-Techtor International Services

(57) ABSTRACT

A method of producing a built-up heat exchanger including the steps of cutting a thermal conductive material to provide a seat in sheet form, forming at least two spaced notches on a top surface of the seat, cutting a thermal conductive material to provide radiators in sheet form, punching the radiators so that a plurality of upward extended fins and at least two downward projected and spaced ridges are formed, applying glue over bottom surfaces of the ridges of the radiators, and superposing the radiators on the top surface of the seat with the bottom-glued ridges fitted in the notches on the seat. The number of fins formed on each radiator and the number of radiators superposed on the seat may be decided depending on the actual need in different applications of the built-up heat exchanger.

3 Claims, 6 Drawing Sheets

METHOD OF PRODUCING A BUILT-UP HEAT EXCHANGER AND PRODUCT THEREOF

BACKGROUND OF THE INVENTION

The present invention relates to a method of producing a built-up heat exchanger and product thereof, and more particularly to a built-up heat exchanger in which a total heat radiating surface area may be easily adjusted according to actual need in different applications.

Following the rapid development in the information industry, various kinds of electronic elements, such as chips, microprocessors, etc., all have high operating temperatures. It is therefore necessary to provide such elements with heat radiating means in the form of heat exchanging devices.

A conventional heat exchanging device includes a radiator integrally formed from a whole piece of extruded aluminum. Such one-piece extruded aluminum radiators require large amounts of aluminum material and have a high manufacturing cost. To eliminate disadvantages existing in the conventional one-piece radiator, less expensive built-up radiators have been developed. Taiwanese New Utility Model Patent Publication No. 223957 discloses a seat 2 for fixedly receiving a plurality of radiating fins 1 thereon, as shown in FIG. 1. The radiating fins 1 are each in the form of a plate having a lower end inserted in one of a plurality of parallel grooves formed on the seat 2. The parallel grooves include deep and shallow grooves 21 and 22, respectively, alternately arranged on the seat 2. The radiating fins 1 are inserted in the deep grooves 21.

A radiator built up from the above-described radiating fins 1 and seat 2 has the following drawbacks:

1. There are fixed numbers of deep grooves 21 on the seat 2 for receiving only fixed numbers of radiating fins 1. Therefore, the radiator so formed has limited radiating efficiency due to limited heat radiating surface area provided by the fixed numbers of radiating fins 1. The radiator can not be adapted to applications that require a higher radiating efficiency.
2. Although the radiating fins 1 can be designed to have different heights to increase total radiating surface area thereof, the radiating fins 1 tend to move in or even separate from the deep grooves 21 if they are too high. Moreover, the heightened radiating fins 1 require a considerably large mounting space.
3. The deep grooves 21 do not provide sufficient strength for associating the radiating fins 1 with the seat 2, particularly when the radiator formed from the radiating fins 1 and the seat 2 has an increased volume.

The present invention therefore develops a built-up heat exchanger that eliminates the drawbacks existing in the conventional one-piece radiator and the built-up radiator disclosed in Taiwanese New Utility Model Patent Publication No. 223957.

SUMMARY OF THE INVENTION

A primary object of the present invention is to provide a built-up heat exchanger formed from a seat and a plurality of superposed radiators having adjustable numbers of radiating fins formed thereon by means of punching, so that the built-up heat exchanger is adaptable to various applications having different heat radiating requirements.

Another object of the present invention is to provide a method for producing the built-up heat exchanger.

The method of producing a built-up heat exchanger according to the present invention mainly includes the steps of cutting a thermal conductive material to provide a seat in sheet form, forming at least two spaced notches on a top surface of the seat, cutting a thermal conductive material to provide radiators in sheet form, punching the radiators so that a plurality of upward extended fins and at least two downward projected and spaced ridges are formed, applying glue over bottom surfaces of the ridges of the radiators, and superposing the radiators on the top surface of the seat with the bottom-glued ridges fitted in the notches on the seat.

A built-up heat exchanger produced in the method of the present invention mainly includes a seat and a plurality of radiators superposed on a top of the seat. The seat is made of thermal conductive material in sheet form and has at least two notches formed on a top surface thereof. The radiators are made of thermal conductive material in sheet form and are punched to form a plurality of upward extended fins and at least two downward projected ridges corresponding to the two notches on the seat, such that any of the radiators may be superposed on the top surface of the seat with the at least two downward projected ridges received in the at least two notches.

BRIEF DESCRIPTION OF THE DRAWINGS

The above and other objects and the features and effects of the present invention may be best understood by referring to the following detailed description of the preferred embodiments and the accompanying drawings, wherein.

DETAILED DESCRIPTION OF THE PREFERRED EMBODIMENTS

Figure 1:
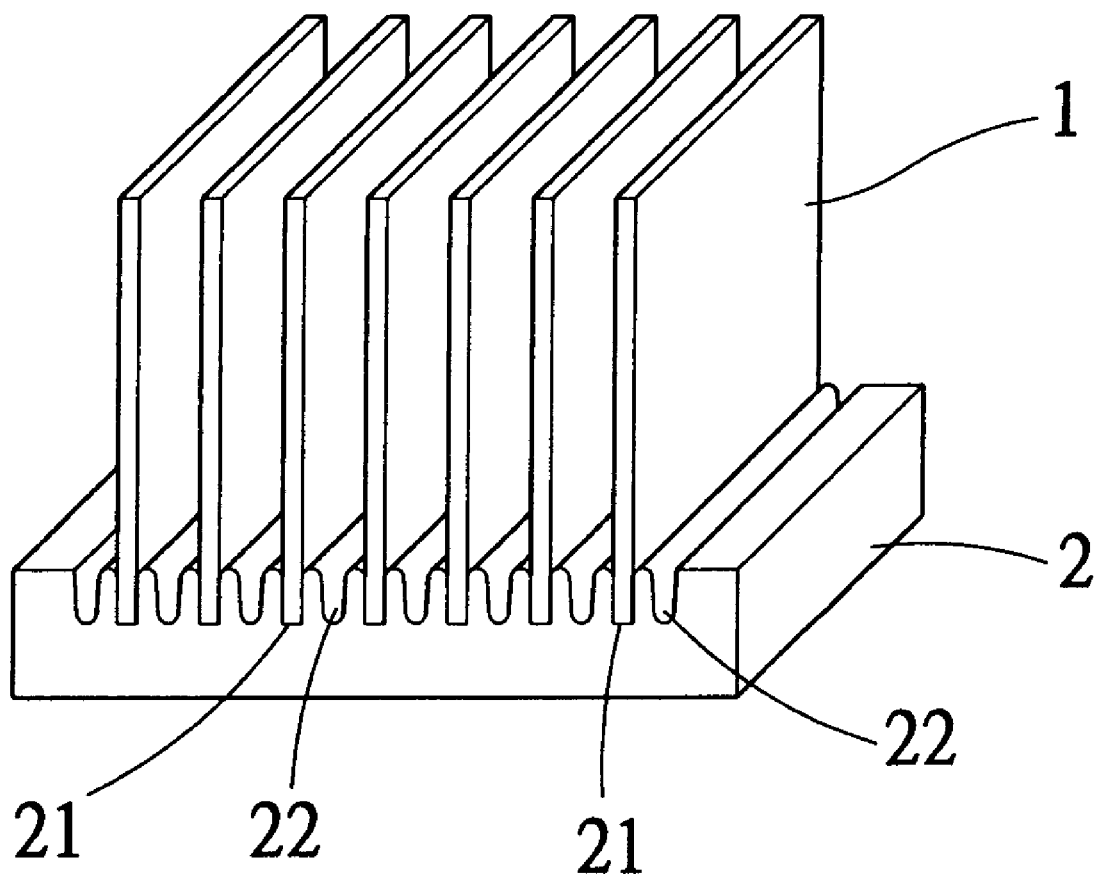
FIG. 1 is a perspective view of a conventional built-up radiator.
Figure 2:
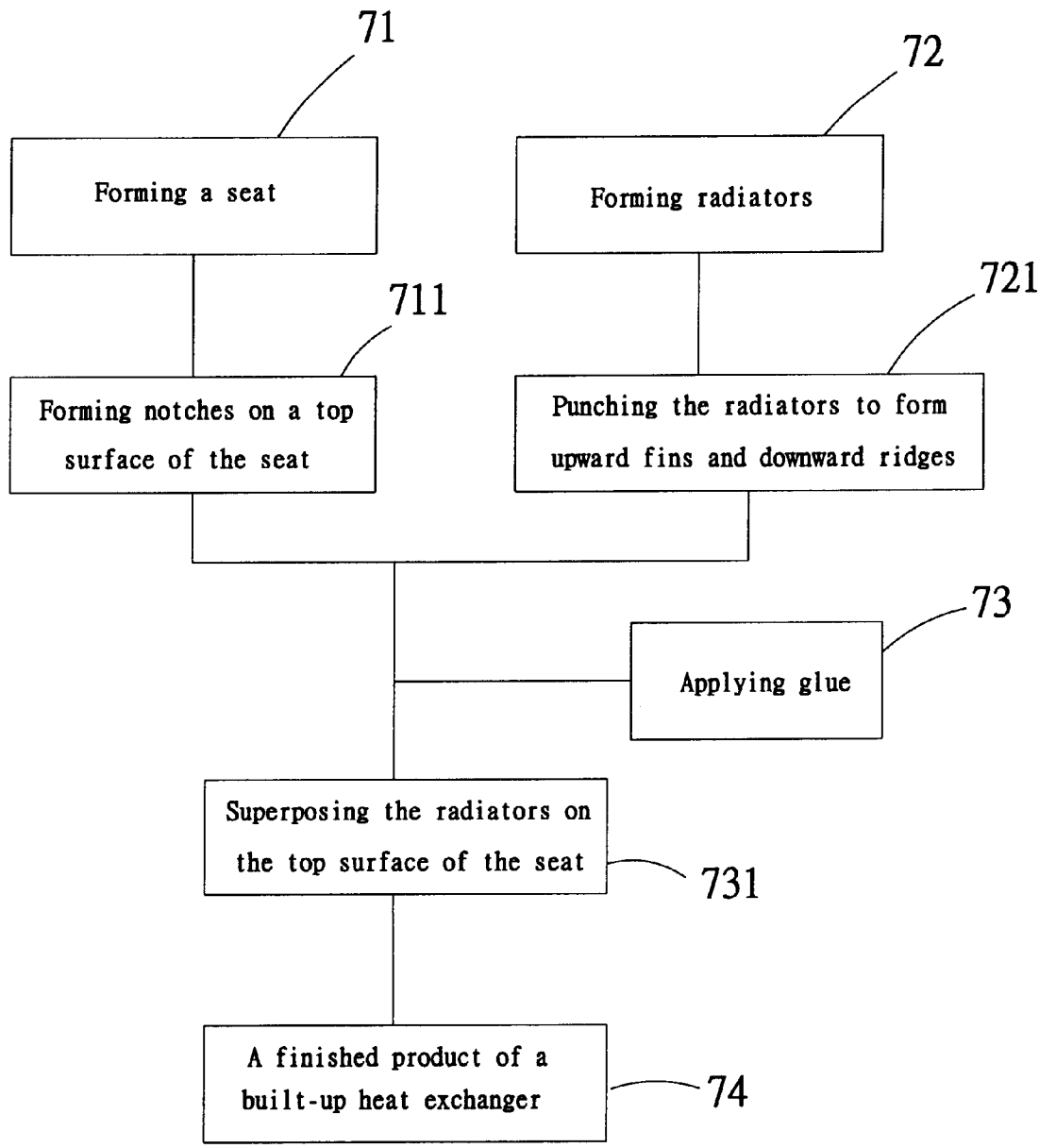
FIG. 2 is a flow chart illustrating the method of the present invention for producing a built-up heat exchanger.

Please refer first to FIG. 2, a flow chart of a method for producing a built-up heat exchanger according to the present invention. As shown in FIG. 2, the method mainly includes two parts, namely, forming a seat 3 and forming a plurality of radiators 4. The forming of the seat 3 includes the steps of cutting a thermal conductive material to provide the seat 3 in sheet form (step 71), and forming at least two spaced notches 31 on a top surface of the seat 3, and two symmetrical and projected ribs 32 extended along two lateral edges of the seat 3 parallel to the two notches 31 (step 711).

The forming of the radiators 4 includes the steps of cutting a thermal conductive material to provide a plurality of radiators 4 in sheet form (step 72), punching each of the radiators 4 so that a plurality of upward extended fins 41 and at least two downward projected and spaced ridges 42 corresponding to the notches 31 on the seat 3 both in shape and position are formed on each radiator 4 (step 721).

The method of the present invention for forming a built-up heat exchanger further includes the steps of applying an adhesive over the bottom surfaces of the ridges 42 of all the radiators 4 (step 73), and sequentially superposing the radiators 4 on the top surface of the seat 3 with the bottom-glued ridges 42 fitted in the notches 31 formed on the seat 3 (step 731), so that a built-up heat exchanger 100 according to the present invention is formed (step 74).

Figure 3:
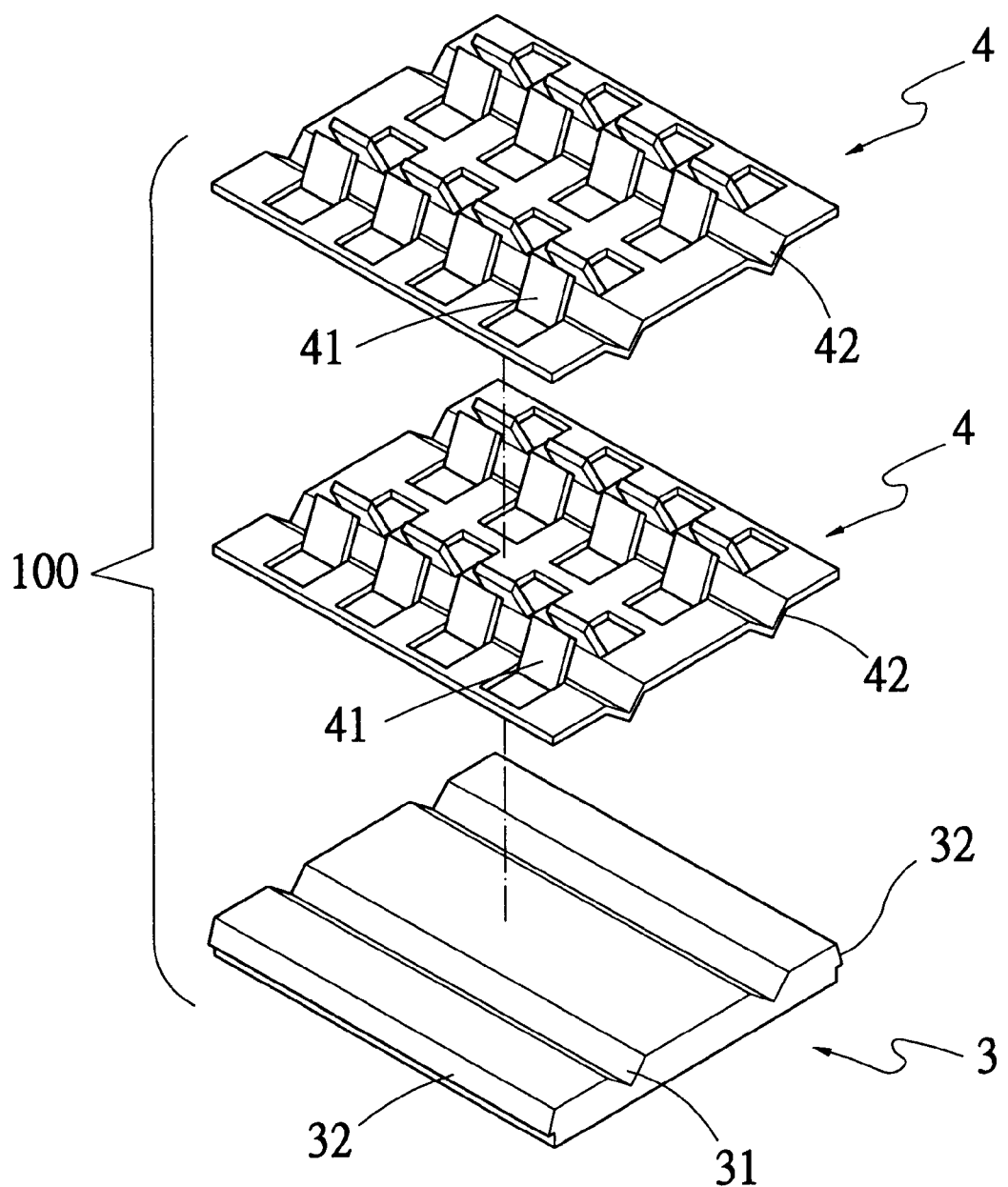
FIG. 3 is an exploded perspective view of the built-up heat exchanger according to an embodiment of the present invention.
Figure 4:
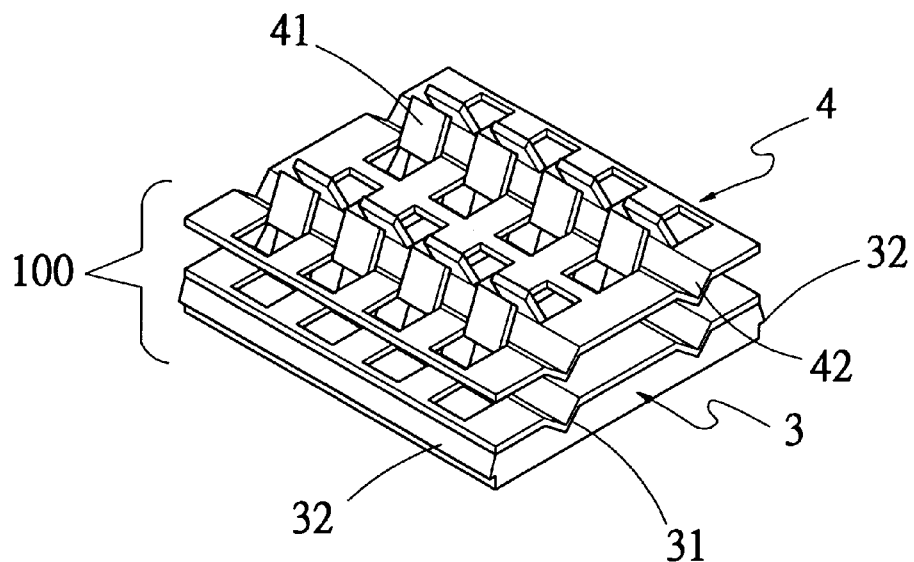
FIG. 4 is an assembled perspective view of the built-up heat exchanger of FIG. 3.

The built-up heat exchanger 100 produced in the above described method of the present invention is shown in FIGS. 3 and 4, exploded and assembled perspective views, respectively, of the heat exchanger 100 of the present invention. As shown, the built-up heat exchanger 100 mainly includes a seat 3 and a plurality of radiators 4 superposed on the seat 3.

The seat 3 is made of thermal conductive material in sheet form and has predetermined dimensions. Two notches 31 having V-shaped cross sections are formed on a top surface of the seat 3. Two symmetrical and projected ribs 32 are formed along two lateral edges of the seat 3 parallel to the two notches 31.

The plurality of radiators 4 are made of thermal conductive material in sheet form and have predetermined dimensions. Each of the radiators 4 is punched to form a plurality of upward extended fins 41 and two downward projected ridges 42. The ridges 42 have V-shaped cross sections corresponding to those of the notches 31 on the seat 3, and are formed at positions corresponding to the notches 31. The fins 41 are arranged in symmetrical rows on top surfaces of the radiators 4 and are symmetrically arranged at two longitudinal sides of each ridge 42. Therefore, any two radiators 4 may be superposed with the two ridges 42 of an upper radiator 4 separately aligned with the two ridges 42 of a lower radiator 4.

Figure 5:
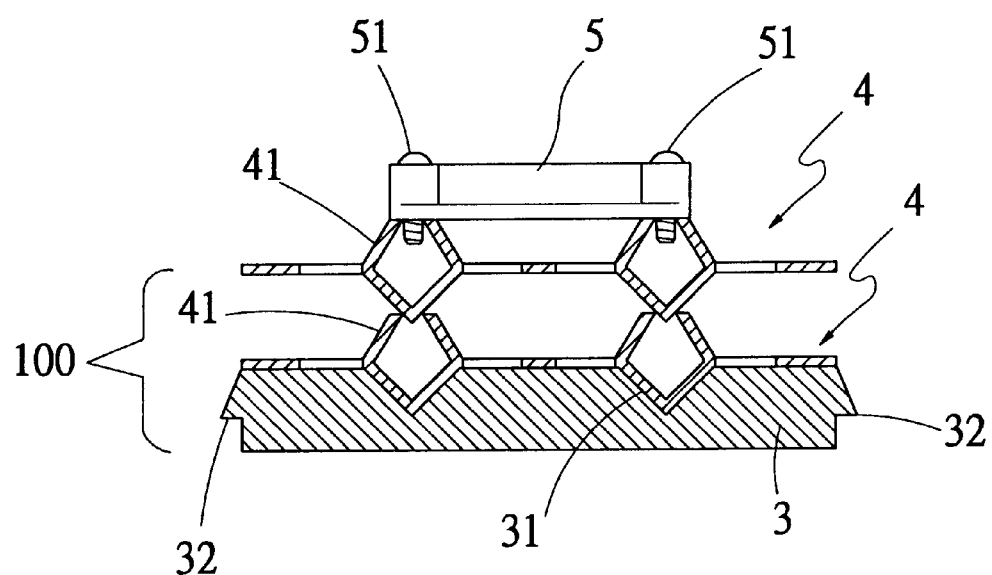
FIG. 5 is a sectional view of the built-up heat exchanger of FIG. 4 with a cooling fan mounted to a top thereof.

The plurality of radiators 4 are sequentially superposed on the top surface of the seat 3, as shown in FIGS. 4 and 5. Numbers of radiators 4 superposed on the seat 3 may be decided depending on actual need of the built-up heat exchanger 100 in different applications. In an embodiment illustrated in FIGS. 3 through 7, there are two radiators 4 superposed on the seat 3.

Before the radiators 4 are superposed on the top surface of the seat 3, a selected type of thermal conductive glue or adhesive such as epoxy resin, is applied over a bottom surface of each ridge 42 of the radiators 4. The two bottom-glued ridges 42 of a first radiator 4 that is directly superposed on the seat 3 are firmly adhered to the two notches 31 of the seat 3. The two bottom-glued ridges 42 of the other radiators 4 that are sequentially superposed on one another above the first radiator 4 and the seat 3 are separately firmly located in spaces provided between two rows of fins 41 at two sides of each of the two ridges 42 of a lower radiator 4.

The built-up heat exchanger 100 may be mounted on an element surface from which a large amount of heat is produced and needs to be radiated quickly. The fins 41 on the radiators 4 of the heat exchanger 100 provide greatly increased heat radiating surface area and accordingly upgraded radiation efficiency. The number of fins 41 punched on each radiator 4 may be decided depending on the actual need in different applications of the built-up heat exchanger 100. The fins 41 at two sides of each ridge 42 of a lower radiator 4 provide a base for locating a ridge 42 of an upper radiator 4. Glue applied over the bottom surface of the ridges 41 further ensures a firm association of the upper radiator 4 with the seat 3 or the lower radiator 4.

To further enhance the radiation efficiency of the built-up heat exchanger 100, a cooling fan 5 may be mounted and locked onto a top of an uppermost radiator 4 on the seat 3 by threading screws 51 through the cooling fan 5 into the spaces provided between two symmetrical rows of fins 41 on the radiators 4.

Figure 6:
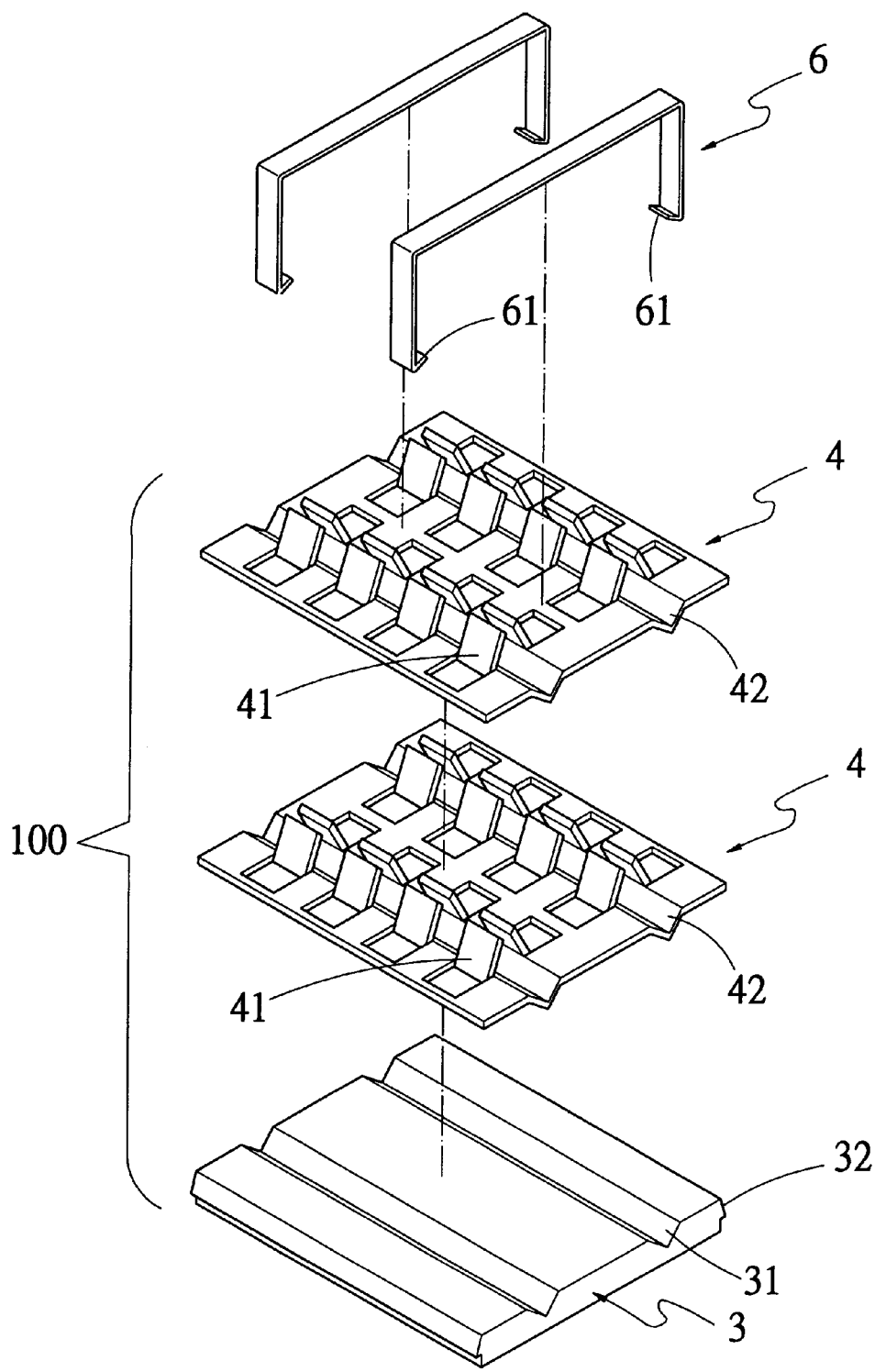
FIG. 6 is an exploded perspective view of the built-up heat exchanger of FIG. 4 showing the superposed radiators and the seat of the heat exchanger firmly bound with fastening means.
Figure 7:
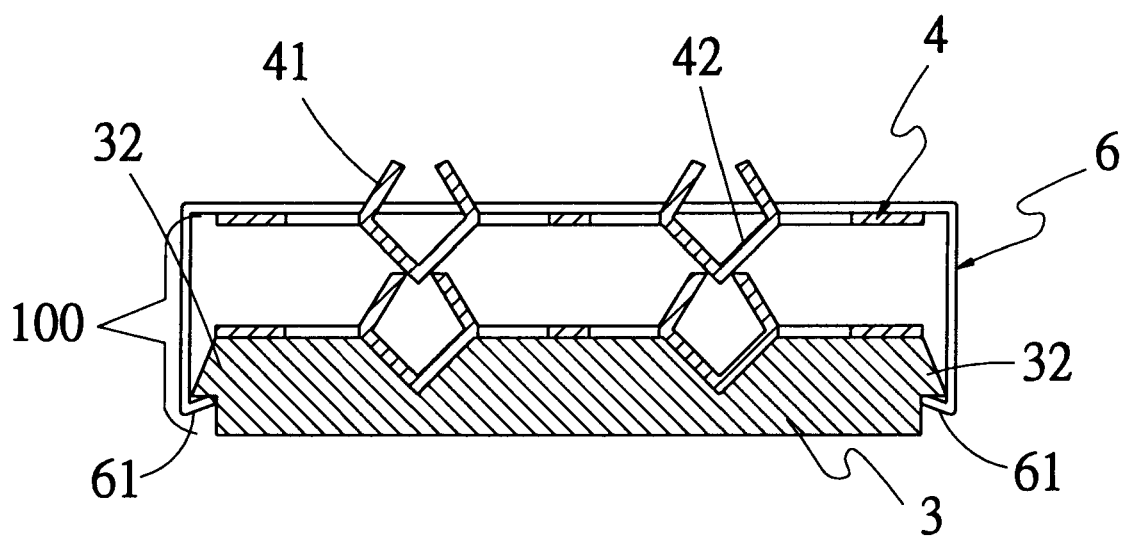
FIG. 7 is a sectional view of the built-up heat exchanger of FIG. 6.

To further ensure a firm and stable superposition of the radiators 4 on the seat 3 by means of glued bottom surfaces of the ridges 42, additional fastening means, such as two or more clamps 6, can be used to clamp and retain the superposed radiators 4 to the seat 3. FIGS. 6 and 7 are exploded perspective and sectional views, respectively, of the built-up heat exchanger 100 provided with two clamps 6. Each clamp 6 has two downward extended hooked legs 61 that are secured on the ribs 32 at two lateral sides of the seat 3 when the clamp 6 is positioned over the superposed radiators 4 and seat 3.

Advantages and features of the present invention are summarized as follows:

1. Since the numbers of fins 41 on the radiators 4 may be decided depending on actual need in different applications of the heat exchanger 100, the radiation effect of the present invention is adjustable without limitation, allowing the present invention to be used in a wide range of applications.
2. Since the radiators 4 superposed on the seat 3 may be increased in number depending on actual need without occupying too much space, the use and mounting of the built-up heat exchanger 100 is not limited due to spatial factors.
3. The radiators 4 and the seat 3 may be easily assembled, allowing the built-up heat exchanger 100 to be particularly suitable for use in products that require high-volume radiators.

What is to be further noted is that the form of the present invention shown and disclosed is to be taken as a preferred embodiment of the invention, and that various changes in the shape, size, and arrangements of parts may be resorted to without departing from the spirit of the invention or the scope of the claims. For instance, the radiators 4 may be punched to form the fins 41 in different numbers, in different positions, and/or at different inclining angles.

Moreover, the cooling fan 5 is not necessarily mounted onto the highest radiator 4 on the seat 3 by means of screws. An alternative of mounting the cooling fan 5 is to form a through hole centered at the superposed radiators 4 and having a diameter slightly smaller than an outer periphery of the cooling fan 5, so that the cooling fan 5 is received in the through hole with its outer periphery supported on an outer periphery of the through hole on the highest radiator 4 and fixed thereto by means of screws 51. For this purpose, it is not necessary to form fins 41 on the radiators 4 in areas intended for the through hole for mounting the cooling fan 5.

What is claimed is:

1. A method of producing a built-up heat exchanger, comprising the following steps:

cutting a thermal conductive material to provide a seat in sheet form;

forming at least two notches on a top surface of said seat;

cutting a sheet of thermally conductive material to provide a radiator;

punching said radiator from a bottom side to a top side to form a series of spaced tabs in said radiator so that a plurality of rows of said tabs form a plurality of upward extended fins, and further forming said radiator so that at least two downward projected ridges corresponding in shape and position to said notches on said seat are formed on said radiator;

applying an adhesive to bottom surfaces of said ridges of said radiator; and positioning said radiator on said top surface of said seat with said ridges received in said notches on said seat, so that a built-up heat exchanger is formed.

2. The method of producing a built-up heat exchanger as claimed in claim 1, wherein:

a plurality of said radiators are formed and sequentially superposed on the top surface of said seat.

3. The method of producing a built-up heat exchanger as claimed in claim 2, wherein:

said plurality of radiators superposed on said seat are bound to said seat by dampers that extend across a top of said superposed radiators with lower legs hooking at two lateral edges of said seat.

* * * * *